(12) United States Patent
Gold

(10) Patent No.: US 6,563,441 B1
(45) Date of Patent: May 13, 2003

(54) AUTOMATIC GENERATION OF PROGRAM LOGIC TO DECODE VARIABLE-LENGTH CODES

(75) Inventor: Kevin C. Gold, Palo Alto, CA (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/142,473

(22) Filed: May 10, 2002

(51) Int. Cl.[7] ............... H03M 7/00; H03M 7/40
(52) U.S. Cl. ..................... 341/67; 341/106
(58) Field of Search ................ 341/67, 51, 65, 341/106; 382/246, 232; 707/3

(56) References Cited

U.S. PATENT DOCUMENTS

| | | | |
|---|---|---|---|
| 4,535,320 A | * 8/1985 | Weaver | 341/65 |
| 4,853,696 A | * 8/1989 | Mukherjee | 341/65 |
| 5,202,986 A | * 4/1993 | Nickel | 707/3 |
| 5,436,626 A | 7/1995 | Fujiwara et al. | 341/67 |
| 5,694,127 A | 12/1997 | Tayama | 341/67 |
| 5,821,887 A | 10/1998 | Zhu | 341/67 |
| 5,870,039 A | 2/1999 | Imanishi et al. | 341/67 |
| 5,915,041 A | * 6/1999 | Thielens | 382/232 |
| 6,188,797 B1 | * 2/2001 | Moledina et al. | 382/246 |
| 6,219,457 B1 | 4/2001 | Potu | 382/246 |
| 6,307,489 B1 | * 10/2001 | Freking et al. | 341/65 |
| 6,313,766 B1 | 11/2001 | Langendorf et al. | 341/67 |

* cited by examiner

*Primary Examiner*—Patrick Wamsley
(74) *Attorney, Agent, or Firm*—Michael T. Gabrik

(57) ABSTRACT

A program for decoding variable-length codes like Huffman codes is generated by receiving information describing a particular coding scheme that defines an association between source symbols and the variable-length codes, generating a binary tree that represents the coding scheme, generating a lookup table from the binary tree that can be used to decode variable-length codes having a length less than or equal to a threshold length, and processing the binary tree and the lookup table to generate the decode program.

8 Claims, 2 Drawing Sheets

AUTOMATIC GENERATION OF PROGRAM LOGIC TO DECODE VARIABLE-LENGTH CODES

TECHNICAL FIELD

The present invention relates to the automatic generation of a program that may be used to decode encoded information that contains variable-length codes.

BACKGROUND ART

Data compression techniques are used in a wide range of applications to reduce the capacity requirements of text, audio, video, and other forms of source data. Some data compression techniques use so called entropy coding like Huffman coding or Shannon-Fano coding to reduce capacity requirements by encoding segments or symbols of source data into variable-length codes. Shorter codes are associated with symbols of source data that occur more frequently. Longer codes are associated with symbols that occur less frequently.

Any process or apparatus that is expected to successfully decode the variable-length codes requires information that establishes an association between each symbol of source data and the corresponding variable-length code. This association for many compression techniques can often be represented by a binary tree structure with a root node and two or more other nodes that are connected by branches in such a way that each of the other nodes is a child node that connects to only one parent node, each parent node connects to at most two child nodes, and the branches that connect a parent node and its child nodes are assigned one of two binary values, zero or one. Each node in the tree has a depth, which is the number of branches that must be crossed or "traversed" to travel from the root node to that particular node. The root node has a depth equal to zero. A node that is an immediate child of the root node has a depth equal to one.

A node that does not connect to any child node is a leaf node that represents a symbol of source data. The variable-length code associated with the symbol for a particular leaf node corresponds to a sequence of bits equal to the binary values of the branches that are encountered along a path from the root node to the particular leaf node. The bit length of a variable-length code is equal to the depth of the leaf node with which it is associated.

The association between a particular set of symbols of source data and a set of corresponding variable-length codes is referred to herein as a "coding scheme." Different applications will generally use different coding schemes because the frequency of occurrence of source data symbols generally varies from one application to another. The amount of compression that can be achieved by entropy coding techniques depends on correctly associating shorter length codes with more frequently occurring symbols.

Decoding apparatuses are often implemented by digital processors that execute one or more programs of instructions. If the association between a symbol of source data and the corresponding variable-length codes can be represented by a binary tree, then decoding may be performed by a general purpose decoding program that is capable of adapting its decoding process to different coding schemes. The decoding process is controlled by a data structure that represents a particular binary tree including the symbols associated with each leaf node. This general purpose program receives encoded information as a serial stream of input bits, crosses or "traverses" one branch of the binary tree data structure for each received bit until reaching a leaf node, generates the symbol associated with that leaf node as the decoded output, and continues the decoding process by crossing or "traversing" branches in the binary tree starting at the root node for the next input bit. The general purpose decoding program is not very efficient because of the processing that is required to traverse branches in the binary tree.

A program that is specific to a particular coding scheme is more efficient. Unfortunately, a programmer is required to write a different program for each coding scheme. The programming process is time consuming and error prone.

DISCLOSURE OF INVENTION

It is an object of the present invention to provide for the automatic generation of program logic that can be used to decode variable-length codes from essentially any coding scheme that can be represented by a binary tree.

According to one aspect of the present invention, an apparatus with processing circuitry performs a process that generates a program of instructions to be used to decode encoded information having variable-length codes. The process obtains data that describes the association between source symbols and variable-length codes for a particular coding scheme, generates a binary tree that represents these associations in the coding scheme, processes the binary tree to generate a lookup table to decode variable-length codes having a length less than or equal to a threshold length, and processes the binary tree and the lookup table to generate a program having logic to decode variable-length codes having a length longer than the threshold length. In another aspect, the process is expressed as a program of instructions conveyed by a medium that is readable by a device.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Overview

The present invention generates a decode program that can be used to decode variable-length codes that were generated according to a particular coding scheme. The following discussion assumes the variable-length codes have a property that is common to many known coding schemes; namely, no valid code is the prefix of any other valid code. In other words, the codes are such that a stream of encoded information can be parsed unambiguously into codes without requiring any special symbols or controls to mark the boundary between codes.

The first portion of the decode program uses a lookup table (LUT) to decode variable-length codes having a length less than or equal to some threshold length. The second portion invokes a static logic structure that models the particular coding scheme to decode variable-length codes having a length greater than the threshold length.

Figure 1:
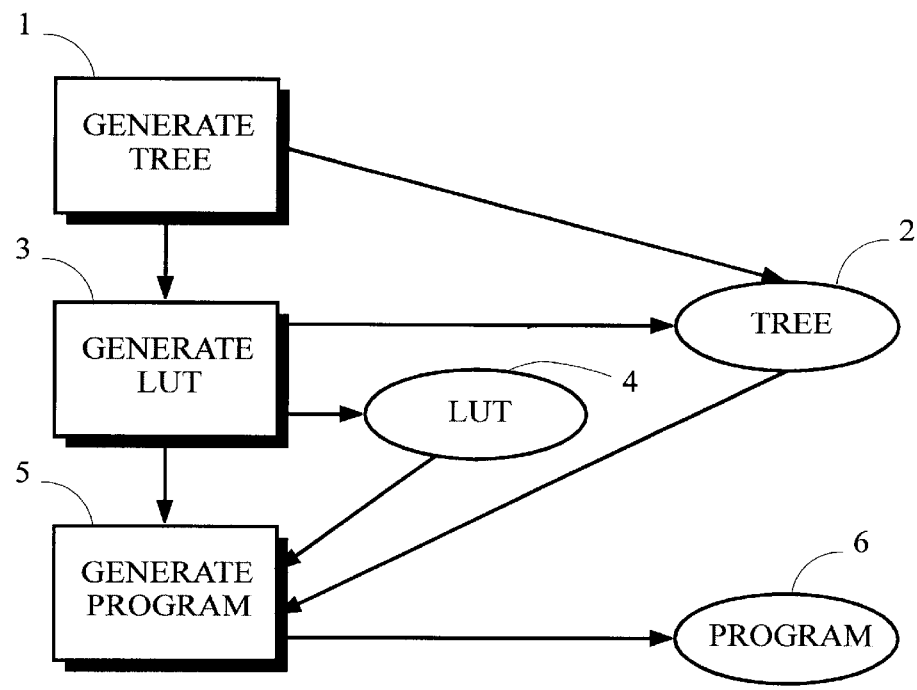
FIG. 1 illustrates a process that may be used to generate a decode program.

FIG. 1 illustrates one process that may be used to generate the decode program. In this process, step 1 obtains information that describes the associations between variable-length codes and symbols of source data for a particular coding scheme and generates a corresponding binary tree structure 2. Step 3 uses the binary tree structure 2 to generate the LUT 4 with lookup keys having a length equal to the threshold length mentioned above. Step 5 uses the binary tree structure 2 and the LUT 4 to generate the decode program 6. Each of these steps is described below in more detail.

The present invention may be carried out by devices that are implemented in a wide variety of ways including discrete logic components, one or more ASICs and/or program-controlled processors. The type of implementation is not critical.

Figure 2:
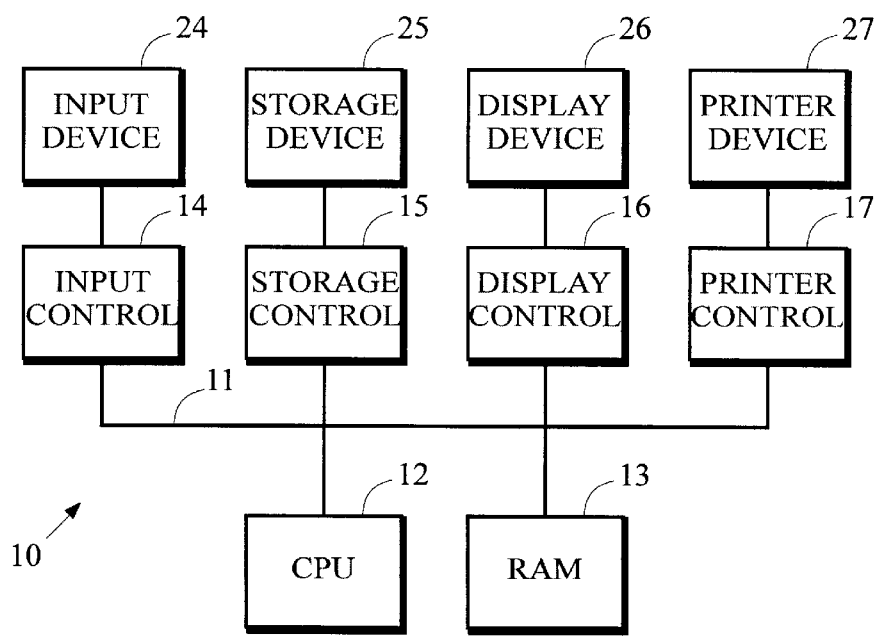
FIG. 2 is a schematic block diagram of a computer system that may be used to carry out various aspects of the present invention.

FIG. 2 is a schematic block diagram of computer system 10 that may be used to carry out the present invention by performing a process such as the one illustrated in FIG. 1. The CPU 12 provides computing resources. The input control 14 represents an interface to the input device 24 such as a keyboard or mouse. The storage control 15 represents an interface to the storage device 25 that includes a storage medium such as magnetic tape or disk, an optical medium or solid-state medium. The storage medium may be used to record programs of instructions for operating systems, utilities and applications such as those that can carry out various aspects of the present invention. The display control 16 provides an interface to the display device 26 such as a monitor with a cathode ray tube or liquid crystal display panel. The printer control 17 provides an interface to the printer device 27 such as an ink jet or laser printer. RAM 13 is system random access memory (RAM). In the example shown in the figure, all major components of computer system 10 connect to bus 11, which may represent more than one physical bus. A bus architecture is not required to practice the present invention.

The following discussion refers to a software implementation, which includes source code fragments that have syntactical features of a product called Visual Basic. These source code fragments are not intended to be practical implementations but are provided only to help explain the present invention. No particular programming language and no particular implementation is critical. For example, the binary tree structure is represented by a set of three-dimensional arrays. The structure could instead be represented by a three dimensional array, by one or more linked-lists, by data structures that use pointers, or essentially any other data structure that may be desired.

B. Generate Binary Tree

Referring to the process illustrated in FIG. 1, step 1 obtains information that describes particular coding scheme and generates the binary tree structure 2. An example of the association between variable-length codes and source symbols for a particular coding scheme is shown in Table I. In this example, text characters are used to represent the source symbols because it is convent for discussion and illustration.

In practice, however, the source symbols can be any digital information including segments of digital audio or video data.

TABLE I

| Code | Symbol |
|------|--------|
| 00000 | 5 |
| 00001 | 4 |
| 000101 | # |
| 001 | U |
| 010 | R |
| 0110 | P |
| 10000 | 6 |
| 10001 | — |
| 10010 | / |
| 101 | K |
| 11000 | 7 |
| 11100 | 8 |
| 11110 | 9 |
| 11111 | 0 |

Each of the source symbols correspond to a leaf node in a binary tree. The sequence of bits in each of the codes defines the sequence of branches in the binary tree that are encountered while traversing the binary tree from the root node to the respective leaf node. Terms like "traverse" and "traversing" as used in this disclosure refer to movement or travel across one or more branches in the binary tree that define a path from one node to another.

Figure 3:
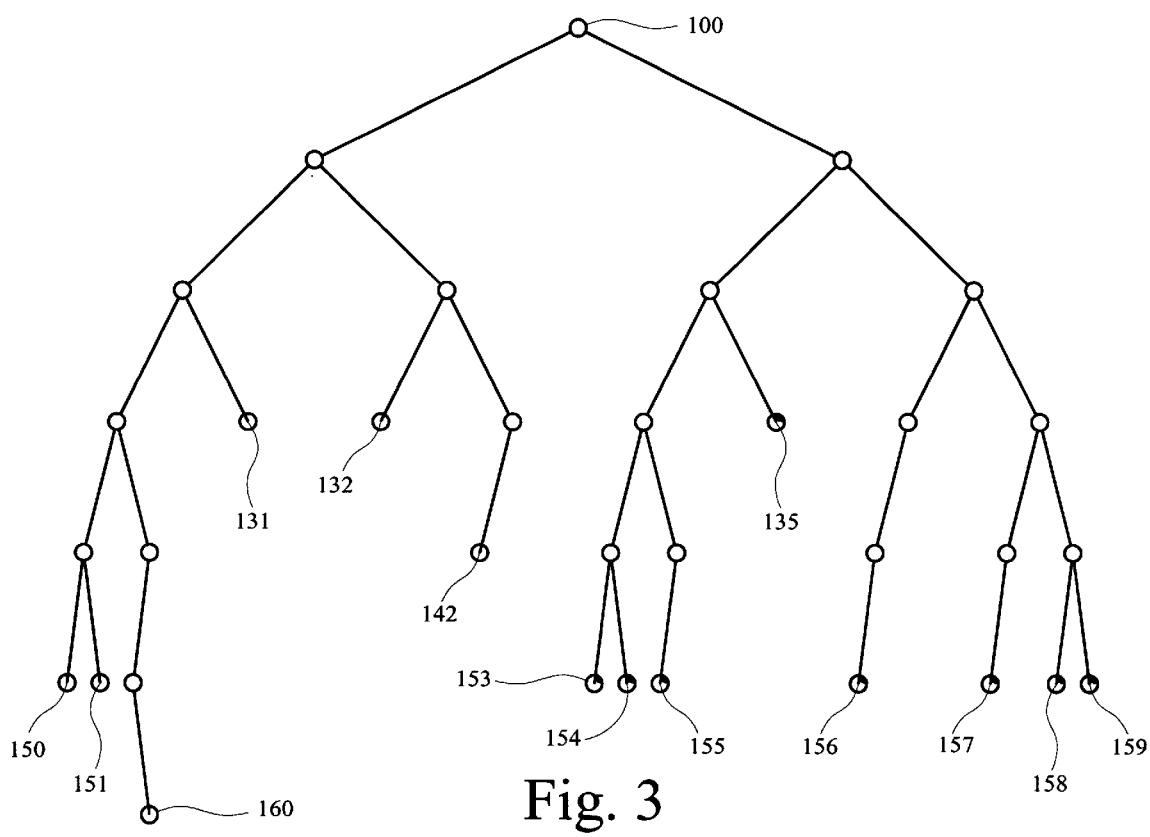
FIG. 3 illustrates a binary tree.

A binary tree that represents the coding scheme shown in Table I is illustrated in FIG. 3. Code 001, for example, specifies a traversal path from root node 100 to leaf node 131 that encounters two "zero" or left branches followed by a "one" or right branch. Leaf node 131 is associated with the "U" source symbol. Similarly, codes 010 and 101 specify traversal paths to leaf nodes 132 and 135, respectively, code 0110 specifies the traversal path to leaf node 142, and code 000101 specifies the traversal path to leaf node 160. All other codes in the coding scheme specify traversal paths to respective leaf nodes 150–159. The length of the code is equal to the depth of the corresponding leaf node.

A coding scheme may be described in essentially any way that is desired. In the example program shown below, functions GetBinSymbol and GetValue are used to obtain the coding scheme description from a serial stream of data arranged in a sequence of VLC-EOC-SYM segments. Each VLC segment conveys a sequence of binary symbols, zero and one, that specifies a particular variable-length code. The end of each code is marked by an end-of-code (EOC) segment. The SYM segment conveys the source symbol that is associated with the variable-length code that immediately precedes it. The end of the serial stream of information is indicated by an end-of-stream (EOS) mark.

```
Sub GenerateTree( )
    NodeCount = 0
    ValueListCount = 0
    Node = Root
    BinSymbol = GetBinSymbol
    While BinSymbol <> "EOS"
        If BinSymbol = "0" Then          'if a 0 symbol . . .
            If TreeLeft0(Node) = 0 Then      'if no left
                                              pointer . . .
                NodeCount =                 'create new
                NodeCount + 1                node
                TreeLeft0(Node) = NodeCount
                TreeLeft0(NodeCount) = 0
```

-continued

```
            TreeRight1(NodeCount) = 0
            TreeValue(NodeCount) = 0
        End If
        Node = TreeLeft0(Node)          'traverse left link
    ElseIf BinSymbol = "1" Then         'if a 1 symbol . . .
        If TreeRight1(Node) = 0 Then    'if no right pointer . . .
            NodeCount =                 'create new node
                NodeCount + 1
            TreeRight1(Node) = NodeCount
            TreeLeft0(NodeCount) = 0
            TreeRight1(NodeCount) = 0
            TreeValue(NodeCount) = 0
        End If
        Node = TreeRight1(Node)         'traverse right link
    ElseIf BinSymbol = "EOC" Then       'else at end of
                                        code symbol . . .
        ValueListCount = ValueListCount + 1
        TreeValue(NodeCount) =          'set pointer
            ValueListCount              to value list
        ValueList(ValueListCount) =     'save value in list
            GetValue
        Node = Root                     'return to root for next code
    End If
    BinSymbol = GetBinSymbol
  Wend
End Sub
```

This routine generates a set of arrays TreeLeft0( ), TreeRight1( ) and TreeValue( ) that represent the binary tree. Each respective element of the three arrays corresponds to a particular node in the tree. The elements TreeLeft0(0), TreeRight1(0) and TreeValue(0) represent the root node.

Elements in the array TreeLeft0( ) represent the left branches for nodes in the tree. Elements in the array TreeRight1( ) represent the right branches for nodes in the tree. The zero in the array name "TreeLeft0" and the one in the array name "TreeRight1" are reminders that the left and right branches in this binary tree correspond to the binary values zero and one, respectively.

Elements in the array TreeValue( ) refer to elements in array ValueList( ), which contains the symbols associated with the leaf nodes. Elements of array TreeValue( ) that correspond to leaf nodes are not zero. Array elements for all other nodes are zero.

If a particular application uses variable-length codes to represent a set of symbols, the association between each code and the set of symbols could be provided by having each element of array TreeValue( ) refer to elements in a set of symbol arrays, or by having each element of array TreeValue( ) refer to an element of a multi-dimensional symbol array. A number of alternatives are possible.

C. Generate Lookup Table

Referring to the process illustrated in FIG. 1, step 3 uses the binary tree structure 2 to generate the LUT 4, which will be used in the first portion of the decode program generated in step 5. The entries in the LUT will be accessed using a lookup key having a length equal to the threshold length, which is the value of the variable KeyLen. Each entry contains a lookup key, a code-length value, and a reference to a source symbol.

An example of the entries in a LUT for the coding scheme shown in Table I is shown in Table II. In this example, the threshold length "KeyLen" is equal to four.

TABLE II

| Lookup Key | Code Length | Source Symbol |
|---|---|---|
| 0000 | 0 | |
| 0001 | 0 | |
| 0010 | 3 | U |
| 0011 | 3 | U |
| 0100 | 3 | R |
| 0101 | 3 | R |
| 0110 | 4 | P |
| 0111 | 0 | |
| 1000 | 0 | |
| 1001 | 0 | |
| 1010 | 3 | K |
| 1011 | 3 | K |
| 1100 | 0 | |
| 1101 | 0 | |
| 1110 | 0 | |
| 1111 | 0 | |

If a variable-length code in the coding scheme either matches or is a prefix of a lookup key for a particular LUT entry, the code-length value for that entry is set equal to the length of the code. For example, referring to Table I, the variable-length code 001 is a prefix of the LUT lookup keys 0010 and 0011. Similarly, the code 010 is a prefix of lookup keys 0100 and 0101, and the code 101 is a prefix of the lookup keys 1010 and 1011. The code-length values for these entries is set equal to three, which is the length of the respective codes. The code 0110 matches lookup key 0110; therefore, the code-length for this entry is set equal to four. Each of these LUT entries also contains a reference to the source symbol associated with the code. The source symbol itself is shown in Table II. In many implementations including the example shown below, however, the reference is by a pointer or link to another data structure that stores the symbol.

All other entries in the LUT do not have a lookup key that is either equal to or prefixed by a valid code. The code-length for these entries is set to some value that indicates this fact. In the example shown in Table II, the value is zero. Alternatively, the value could be set to a negative value or to a value greater than the threshold length.

In this example program, function BitString is used to obtain a constant length string representation of binary values. The length of the string is equal to the value KeyLen. The number of entries in the LUT is represented by variable TabSize and is equal to $2^{KeyLen}$. The elements in array Bits( ) represent the bit values in a binary expression of the FOR loop index I. The number of elements in the array Bits( ) is equal to the value KeyLen. For example, if KeyLen=4 and I=7, then Bits(0)=0, Bits(1)=1, Bits(2)=1 and Bits(3)=1, and the string returned by BitString is 0111.

```
Sub GenerateLookupTable( )
    For I = 0 To TabSize - 1
        Node = Root                     'start at root of tree
        Depth = 0
        LeafNode = False
        For B = 0 To KeyLen - 1
            If Bits(B) = 0 Then
                Node = TreeLeft0(Node)  'traverse left branch
            Else
                Node = TreeRight1(Node) 'traverse right
                                        branch
            End If
```

```
            If Node = 0 Then Exit For          'exit loop if there
                                               is no branch
            Depth = Depth + 1
            If TreeValue(Node) <> 0 Then       'if a leaf node with
                                               a value . . .
                TabID(I) = BitString
                TabIDLen(I) = Depth
                TabValue(I) = TreeValue(Node)
                LeafNode = True                'skip code
                                               following
                                               FOR loop . . .
                Exit For
            End If
        Next B
        If Not LeafNode Then                   'if not a leaf
                                               node . . .
            TabID(I) = BitString
            TabIDLen(I) = 0                    'indicate not
                                               a leaf node
            TabValue(I) = Node                 'point to corresponding
                                               node in tree
        End If
    Next I
End Sub
```

This routine generates the LUT as a set of arrays TabID( ), TabIDLen( ) and TabValue( ), whose elements represent the lookup key, code-length value, and source symbol reference for each LUT entry, respectively.

Referring to the example program above, a FOR loop is used to generate all integer values I from zero to TabSize-1, which includes all possible bit patterns in a bit string of length equal to KeyLen. This range of values for I includes all combinations of values for the elements of array Bits( ). The values in array Bits( ) are used to traverse the binary tree structure, starting at the root node. The traversal continues until either a leaf node is encountered, a required branch does not exist, or until the traversal has reached a depth equal to KeyLen.

If a leaf node is encountered, the variable-length code associated with that leaf node is either a match or a prefix of the LUT lookup key corresponding to the value I. The element TabValue(I) is set equal to the element in TreeValue (Node), which references the source symbol in array ValueList( ) that is associated with the leaf node.

If a required branch does not exist, the lookup key corresponds to a code or code prefix that is not defined for this particular coding scheme. The element TabValue(I) is set equal to zero to indicate this fact.

If all required branches exist but a leaf node is not encountered before reaching a depth equal to KeyLen, the LUT lookup key corresponding to the value I is associated with an intermediate node in the binary tree that is between the root node and one or more leaf nodes. The element TabValue(I) can be set to any value other than zero. In the example shown above, the element TabValue(I) is used as a pointer to the intermediate node so that step 5 can generate the decode program more efficiently.

In one implementation of the present invention, step 3 generates source code statements that define the contents of the LUT 4 as well as the program logic that uses the LUT for decoding. In the examples shown here, however, step 3 generates only the information needed to generate the LUT itself.

D. Generate Decode Program

Referring to the process illustrated in FIG. 1, step 5 uses the binary tree structure 2 and the LUT 4 to generate the decode program. In the examples shown here, source code statements are generated for programs written in Visual Basic. Essentially any programming language may be used. Furthermore, programs can be generated in forms other than source code statements. For example, executable object code could be generated directly. These aspects are not critical to the present invention.

In the example program shown below, the generated program is a routine named "Decode" that is structured as a function; however, the decode program may be structured in a wide variety of ways. The example is a function that receives as input an encoded message in the form of a string of binary symbols and a pointer that identifies a position within the encoded message. The function decodes the variable-length code in the encoded message that begins at the location specified by the pointer, advances the pointer by the length of the code, and returns the source symbol that is associated with the code.

The example decode program could be invoked by the following program fragment to decode a message.

```
Sub DecodeUsingAutoGeneratedRoutine( )
    EncodedMsg = GetEncodedString
    MsgLength = Len(EncodedMsg)
    MsgPtr = 1
    DecodedMsg = ""
    While MsgPtr < MsgLength
        DecodedMsg = DecodedMsg & Decode(EncodedMsg, MsgPtr)
    Wend
    Print "Decoded message is:"; DecodedMsg
End Sub
```

The Decode function may be generated in three parts. The first part includes program logic that does not vary with changes in the coding scheme. The second part includes logic that is generated to model the particular coding scheme to be decoded and, therefore, will vary with changes in the coding scheme. The third part does not vary with changes in the coding scheme. This may be accomplished in many ways. The following examples illustrate the basic idea.

```
Sub GenerateProgram( )
    Call GenerateFirstPart
    Call GenerateSecondPart
    Call GenerateThirdPart
End
```

It may be helpful to point out that the LUT arrays TabID( ), TabIDLen( ) and TabValue( ) are used by some of the generating programs to control the generation process, and some generated source code statements refer to the LUT arrays, which are used by the generated program itself for decoding.

The following program example uses "print" commands to write source code statements for the first part of the Decode function to an open file.

```
Sub GenerateFirstPart( )
    Print #1, "Function Decode(EncodedMsg As String,
        MsgPtr As Integer)"
    Print #1, "   MsgBits = GetMsgBits(EncodedMsg,    'get bits"
        MsgPtr, Keylen)
```

-continued

```
Print #1, "    BitValue = V(MsgBits)           'get value of the
                                                message bits"
Print #1, "    CodeLen =                        'get code len
                 TabIDLen(BitValue)              from LUT"
Print #1, "    If CodeLen <> 0 Then             'if value found
                                                in LUT . . . "
Print #1, "      Index =                        'get reference
                   TabValue(BitValue)            to symbol"
Print #1, "      DecodedSymbol =                'get symbol"
                   ValueList(Index)
Print #1, "      MsgPtr =                       'advance pointer
                   MsgPtr + CodeLen              to next code"
Print #1, "    Else                             'else if not found in
                                                LUT . . . "
Print #1, "      MsgPtr =                       'advance code
                   MsgPtr + KeyLen               pointer"
Print #1, "    Select Case MsgBits"
End
```

The generated Decode program calls several functions. The function GetMsgBits gets a number "KeyLen" of bits from "EncodedMessage" starting at location MsgPtr. The function call V(MsgBits) gets the value of the binary string in MsgBits.

The first part of the Decode function includes logic that uses the LUT to decode variable-length codes having a length less than or equal to the threshold length. If desired, this logic can be provided in another program. The first part of the Decode program ends with a "Select Case" statement. The body of the select-case structure is provided in the second part, and the end of the select-case structure is provided in the third part.

The following program example generates the body of the select-case structure in the second part of the Decode function.

```
Sub GenerateSecondPart( )
    Indent = 12
    For TabIndex = 0 To TabSize – 1          'scan LUT
        If TabIDLen(TabIndex) = 0 Then       'if no value for
                                             this table entry . . .
            Print #1, Spc(Indent); "Case"; TabID(TabIndex)
            If TabValue(TabIndex) = 0 Then
                Print #1, Spc(Indent + Offset); "DecodedSymbol =
                    UndefCode"
            Else
                Call GenLogic(Indent + Offset,
                    TabValue(TabIndex), Offset)
            End If
        End If
    Next TabIndex
End
```

The variable Indent is used to specify an amount by which each source code statement is indented. This feature is optional but helps produce source code that is easier to read and understand.

The FOR loop in this program fragment processes each entry in the LUT. If the element TabIDLen(TabIndex) indicates the code-length is not zero, no source code statements are generated for this LUT entry because it corresponds to a variable-length code that is decoded in the first part of the Decode function using only the LUT. If the code-length value is zero, a "Case" statement is generated for a value equal to the LUT lookup key. If the element TabValue(I) is also equal to zero, the lookup key represents a code that is undefined in the coding scheme; a source code statement is generated that assigns a special value to the variable DecodedSymbol. Alternatively, one or more source code statements could be generated that report an error and terminate or interrupt the decode process. If the element TabValue(I) is not zero, then the LUT lookup key is a prefix of one or more codes and the array element TabValue(I) is known to refer to an intermediate node in the binary tree structure 2 that corresponds to the prefix. The GenLogic routine is called to generate the appropriate source code statements. This routine is discussed below.

The following program example generates the third part of the Decode function. In this example, the third part merely ends the select-case structure, assigns a value to the variable Decode that the function returns to a calling routine, and ends the function.

```
Sub GenerateThirdPart( )
    Print #1, "        End Select"
    Print #1, "    End If"
    Print #1, "    Decode = DecodedSymbol"
    Print #1, "End Function"
    Print #1, ""
End
```

The program that generates the second part of the Decode function invokes the subroutine GenLogic, which controls the generation of IF-THEN-ELSE source code statements that model part of a particular coding scheme. When necessary, the subroutine calls itself recursively to generated nested IF-THEN-ELSE statements. Alternatively, the program could generate select-case structures, immediate-IF statements, or essentially any other form of conditional logic that can be nested. The type of structure is not important in principle but it may affect execution efficiency.

```
Sub GenLogic(Indent As Integer, Link As Integer,
IndentOffset As Integer)
    If TreeValue(Link) <> 0 Then
        Print #1, Spc(Indent); "DecodedSymbol = ";
        ValueList(TreeValue(Link))
    Else
        Print #1, Spc(Indent); "MsgBits = GetMsgBits(EncodedMsg,
            MsgPtr, 1)"
        Print #1, Spc(Indent); "MsgPtr = Msgptr + 1"
        Print #1, Spc(Indent); "If MsgBits = 0 Then"
        If TreeLeft0(Link) = 0 Then
            Print #1, Spc(Indent + IndentOffset);
                "DecodedSymbol = UndefCode"
        Else
            Call GenLogic(Indent + IndentOffset, TreeLeft0(Link),
                IndentOffset)
        End If
        Print #1, Spc(Indent); "Else"
        If TreeRight1(Link) = 0 Then
            Print #1, Spc(Indent + IndentOffset); "DecodedSymbol =
                UndefCode"
        Else
            Call GenLogic(Indent + IndentOffset, TreeRight1(Link),
                IndentOffset)
        End If
        Print #1, Spc(Indent); "End If"
    End If
End Sub
```

The subroutine receives three variables as input. Two of the input variables, Indent and IndentOffset, are used to control the offset of the generated source code statements. As mentioned above, this feature is optional but helps produce source code that is easier to read and understand.

The third input variable Link is a reference to a node in the binary tree. If Link refers to a leaf node, which is indicated by TreeValue(Link) being equal to a non-zero value, then a source code statement is generated that assigns the appropriate symbol to the variable DecodedSymbol. If Link refers to a node that is not a leaf node, source code statements are generated that get the next bit from the encoded message, advance the message location pointer, and execute an IF statement to determine whether the next bit is a "zero" bit.

The generating program then examines the element TreeLeft0(Link) to determine whether the node referenced by Link has a child node connected by a left branch. If not, a source code statement is generated that indicates the sequence of bits obtained from the encoded message do not form a valid code or the prefix of a valid code. If, however, a left branch does exist for this node, the GenLogic routine is called recursively to generate source code statements for program logic that handles longer codes.

The generating program then generates an ELSE statement to handle the case where the next bit obtained from the encoded message is a "one" bit. The generating program then examines the element TreeRight1(Link) to determine whether the node referenced by Link has a child node connected by a right branch. Additional source code statements are generated in a manner similar to that described above for the left branch.

An example of the generated function Decode is shown below that implements a decode process for the coding scheme shown in Table I and FIG. 3.

```
Function Decode(EncodedMsg As String, MsgPtr As Integer)
    MsgBits = GetMsgBits(EncodedMsg, MsgPtr, KeyLen)   'get bits
    BitValue = V(MsgBits)              'get value of the message bits
    CodeLen = TabIDLen(BitValue)       'get code len from LUT
    If CodeLen <> 0 Then               'if value found in LUT . . .
        Index = TabValue(BitValue)     'get reference to symbol
        DecodedSymbol = ValueList(Index)   'get symbol
        MsgPtr = MsgPtr + CodeLen      'advance pointer to next code
    Else                               'else if not found in LUT . . .
        MsgPtr = MsgPtr + KeyLen       'advance code pointer
        Select Case MsgBits"
            Case 0000
                MsgBits = GetMsgBits(EncodedMsg, MsgPtr, 1)
                MsgPtr = MsgPtr + 1
                If MsgBits = 0 Then
                    DecodedSymbol = "5"
                Else
                    DecodedSymbol = "4"
                End If
            Case 0001
                MsgBits = GetMsgBits(EncodedMsg, MsgPtr, 1)
                MsgPtr = MsgPtr + 1
                If MsgBits = 0 Then
                    MsgBits = GetMsgBits(EncodedMsg, MsgPtr, 1)
                    MsgPtr = MsgPtr + 1
                    If MsgBits = 0 Then
                        DecodedSymbol = UndefCode
                    Else
                        DecodedSymbol = "#"
                    End If
                Else
                    DecodedSymbol = UndefCode
                End If
            Case 0111
                DecodedSymbol = UndefCode
            Case 1000
                MsgBits = GetMsgBits(EncodedMsg, MsgPtr, 1)
                MsgPtr = MsgPtr + 1
                If MsgBits = 0 Then
                    DecodedSymbol = "6"
                Else
                    DecodedSymbol = "–"
                End If
            Case 1001
                MsgBits = GetMsgBits(EncodedMsg, MsgPtr, 1)
                MsgPtr = MsgPtr + 1
                If MsgBits = 0 Then
                    DecodedSymbol = "/"
                Else
                    DecodedSymbol = UndefCode
                End If
            Case 1100
                MsgBits = GetMsgBits(EncodedMsg, MsgPtr, 1)
                MsgPtr = MsgPtr + 1
                If MsgBits = 0 Then
                    DecodedSymbol = "7"
                Else
                    DecodedSymbol = UndefCode
                End If
            Case 1101
                DecodedSymbol = UndefCode
            Case 1110
                MsgBits = GetMsgBits(EncodedMsg, MsgPtr, 1)
                MsgPtr = MsgPtr + 1
                If MsgBits = 0 Then
                    DecodedSymbol = "8"
                Else
                    DecodedSymbol = UndefCode
                End If
            Case 1111
                MsgBits = GetMsgBits(EncodedMsg, MsgPtr, 1)
                MsgPtr = MsgPtr + 1
                If MsgBits = 0 Then
                    DecodedSymbol = "9"
                Else
                    DecodedSymbol = "0"
                End If
        End Select
    End If
    Decode = DecodedSymbol
End Function
```

It is also possible to generate a Decode program that decodes variable-length codes having a length longer than the threshold length by using logic that models the binary tree from the root node; however, this type of program would not be as efficient as the type described above with logic that models only the part of the binary tree extending below nodes having a depth equal to the value of the lookup key threshold length.

In an analogous way, it is possible to generate a Decode program like the type shown above by using a generating program that traverses the binary tree from the root node for each code having a length longer than the threshold length. The generation process would not be as efficient.

What is claimed is:

1. A medium readable by a device and conveying a first program of instructions executable by the device to perform a method for generating a second program of instructions to be used to decode encoded information having variable-length codes, wherein the method comprises:

obtaining data that defines connections between a root node and a plurality of other nodes such that each of the other nodes is a child node that connects to one respective parent node, each parent node connects to at most two child nodes, and the connections between a parent node and its respective child nodes are associated with either of two binary values, wherein a node that does not connect to any child node is a leaf node, and obtaining data that defines a respective value for each leaf node;

generating a binary tree data structure representing the root node and the other nodes with branches having binary values and connecting the nodes according to the data that defines connections, wherein each respective node has a depth equal to the number of branches that are encountered during a traverse of the binary tree from the root node to the respective node, and wherein each respective leaf node is associated with a value and a variable-length code derived from a sequence of bits equal to the binary values of the branches that are encountered during a traverse of the binary tree from the root node to the respective leaf node; and traversing the binary tree data structure to generate a first portion of the second program of instructions that includes a lookup table data structure to decode variable-length codes derived from a sequence of bits having a length less than or equal to N, where N is an integer greater than zero, and to generate a second portion of the second program on instructions that includes a static logic structure corresponding to branches in the binary tree data structure to decode variable-length codes derived from a sequence of bits having a length greater than N, wherein the lookup table data structure has a plurality of first entries and a plurality of second entries for a total number of entries less than or equal to $2^N$, each entry identified by a lookup key derived from a sequence of bits of length N, and wherein each first entry is identified by a lookup key that either is prefixed by or is equal to a respective variable-length code having a length M less than or equal to N, and contains information that identifies the length M and the value associated with the leaf node that is associated with the respective variable-length code, and each second entry is identified by a lookup key that is a prefix of one or more variable-length codes having lengths greater than N, and contains an indication that it does not identify a value associated with any leaf node.

2. A medium according to claim 1 wherein the lookup table data structure has one or more third entries, and wherein each third entry is identified by a lookup key that is not prefixed by, is not equal to, and does not prefix any variable-length code in the binary tree data structure, and contains an indication that the lookup key is invalid.

3. A medium according to claim 1 wherein the first portion of the second program of instructions includes logic to access the lookup table data structure in response to lookup keys derived from data obtained from the encoded information.

4. A medium according to claim 1 that generates the second portion of the second program of instructions by processing the lookup table data structure instead of traversing the binary tree data structure from the root node to other nodes having a depth equal to N, wherein each second entry in the lookup table data structure contains a reference to the node in the binary tree data structure that has a depth equal to N.

5. An apparatus comprising memory and processing circuitry coupled to the memory for executing a first program of instructions to perform a process that generates a second program of instructions to be used to decode encoded information having variable-length codes, wherein the process comprises:

obtaining data that defines connections between a root node and a plurality of other nodes such that each of the other nodes is a child node that connects to one respective parent node, each parent node connects to at most two child nodes, and the connections between a parent node and its respective child nodes are associated with either of two binary values, wherein a node that does not connect to any child node is a leaf node, and obtaining data that defines a respective value for each leaf node;

generating a binary tree data structure representing the root node and the other nodes with branches having binary values and connecting the nodes according to the data that defines connections, wherein each respective node has a depth equal to the number of branches that are encountered during a traverse of the binary tree from the root node to the respective node, and wherein each respective leaf node is associated with a value and a variable-length code derived from a sequence of bits equal to the binary values of the branches that are encountered during a traverse of the binary tree from the root node to the respective leaf node; and traversing the binary tree data structure to generate a first portion of the second program of instructions that includes a lookup table data structure to decode variable-length codes derived from a sequence of bits having a length less than or equal to N, where N is an integer greater than zero, and to generate a second portion of the second program on instructions that includes a static logic structure corresponding to branches in the binary tree data structure to decode variable-length codes derived from a sequence of bits having a length greater than N, wherein the lookup table data structure has a plurality of first entries and a plurality of second entries for a total number of entries less than or equal to $2^N$, each entry identified by a lookup key derived from a sequence of bits of length N, and wherein each first entry is identified by a lookup key that either is prefixed by or is equal to a respective variable-length code having a length M less than or equal to N, and contains information that identifies the length M and the value associated with the leaf node that is associated with the respective variable-length code, and each second entry is identified by a lookup key that is a prefix of one or more variable-length codes having lengths greater than N, and contains an indication that it does not identify a value associated with any leaf node.

6. An apparatus according to claim 5 wherein the lookup table data structure has one or more third entries, and wherein each third entry is identified by a lookup key that is not prefixed by, is not equal to, and does not prefix any variable-length code in the binary tree data structure, and contains an indication that the lookup key is invalid.

7. An apparatus according to claim 5 wherein the first portion of the second program of instructions includes logic to access the lookup table data structure in response to lookup keys derived from data obtained from the encoded information.

8. An apparatus according to claim 5 that generates the second portion of the second program of instructions by processing the lookup table data structure instead of traversing the binary tree data structure from the root node to other nodes having a depth equal to N, wherein each second entry in the lookup table data structure contains a reference to the node in the binary tree data structure that has a depth equal to N.

* * * * *